(12) United States Patent
Hwang et al.

(10) Patent No.: US 7,041,520 B1
(45) Date of Patent: May 9, 2006

(54) METHOD FOR FABRICATING LIQUID CRYSTAL DISPLAYS WITH PLASTIC FILM SUBSTRATE

(75) Inventors: Won mi Hwang, Seoul (KR); Jong han Jeong, Seoul (KR)

(73) Assignee: Softpixel, Inc., Gyeonggi-do (KR)

( * ) Notice: Subject to any disclaimer, the term of this patent is extended or adjusted under 35 U.S.C. 154(b) by 0 days.

(21) Appl. No.: 10/965,807

(22) Filed: Oct. 18, 2004

(51) Int. Cl.
H01L 21/00 (2006.01)

(52) U.S. Cl. .................. 438/30; 438/166; 438/482; 438/486

(58) Field of Classification Search ................ 438/30, 438/150, 151, 166, 482, 486, 487
See application file for complete search history.

(56) References Cited

U.S. PATENT DOCUMENTS

| | | | |
|---|---|---|---|
| 6,566,154 B1 | 5/2003 | Yamamoto | |
| 6,696,325 B1 | 2/2004 | Tsai et al. | |
| 6,770,518 B1 * | 8/2004 | Yamazaki et al. | 438/166 |
| 6,808,969 B1 * | 10/2004 | Yamazaki et al. | 438/166 |
| 6,809,012 B1 * | 10/2004 | Yamazaki et al. | 438/482 |
| 6,828,179 B1 * | 12/2004 | Yamazaki et al. | 438/486 |
| 6,878,968 B1 * | 4/2005 | Ohnuma | 438/166 |
| 6,916,693 B1 * | 7/2005 | Ohnuma et al. | 438/162 |
| 6,953,717 B1 * | 10/2005 | Arai et al. | 438/487 |
| 2003/0123019 A1 | 7/2003 | Kim et al. | |
| 2003/0202138 A1 | 10/2003 | Nakamura | |

FOREIGN PATENT DOCUMENTS

JP 11-212116 8/1999

OTHER PUBLICATIONS

English language Abstract of JP 11-212116, Published Aug. 6, 1999.

* cited by examiner

Primary Examiner—Kevin M. Picardat
(74) Attorney, Agent, or Firm—Greenblum & Bernstein, P.L.C.

(57) ABSTRACT

A method for fabricating LCDs based on a plastic film is disclosed. The disclosed method comprise the steps of: attaching a double-sided adhesive tape to a supporting plate using one side thereof; fixing a plastic film substrate onto the supporting plate using an unused side of the double-sided adhesive tape after putting the plastic film substrate and the supporting plate with the double-sided adhesive tape attached thereto through a predetermined thermal treatment to thereby form a lower substrate including the supporting plate, plastic film substrate and the double-sided adhesive tape therebetween; preparing an upper substrate using the steps described above; conducting a substrate forming process on each of the lower and the upper substrates; depositing an orientation film on both the lower substrate and the upper substrate, and rubbing the orientation film; detaching the plastic film substrate from the supporting plate of the lower and the upper substrates to form a plastic front substrate and a plastic rear substrate; spraying spacer particles on one of the plastic front substrate and the plastic rear substrate, and dispensing a sealant on the other substrate; and joining the plastic front substrate and the plastic rear substrate at a distance, injecting a liquid crystal material through an injection opening, and closing the injection opening to thereby form a plastic film liquid crystal display.

18 Claims, 5 Drawing Sheets

METHOD FOR FABRICATING LIQUID CRYSTAL DISPLAYS WITH PLASTIC FILM SUBSTRATE

BACKGROUND OF THE INVENTION

1. Field of the Invention

The present disclosure relates to a method for fabricating liquid crystal displays; and, more particularly, to a method for fabricating an active matrix liquid crystal display (hereinafter referred to as "AM LCD") and a passive matrix liquid crystal display (hereinafter referred to as "PM LCD") based on a plastic film substrate.

2. Background of the Related Art

Liquid crystal displays (hereinafter referred to as "LCDs") based on glass substrates were first introduced in the early sixties, and have been widely adopted as information displays in everyday electronics, for example, calculators, watches, cellular phones, PDAs, audio and video equipments, computers, car dashboards, and the like. These LCDs based on glass substrates, despite their widespread uses, are not without problems, the problems being all related to the inherent properties of the glass substrates. For example, these LCDs are not resistant to shock, relatively heavy, are not bendable, and the thickness thereof is limited by the thickness of the glass substrate used. One obvious solution to such problems is to replace the glass substrates with appropriate plastic film substrates.

FIGS. 1a through 1c are cross-sectional views illustrating a prior art method for manufacturing a liquid crystal display using a plastic film substrate as disclosed in Pub. No. U.S. 2003/0123019.

Referring to FIG. 1a and FIG. 1b, a plastic film substrate 20 is arranged and fixed onto a subsidiary substrate 60 made of a glass through a heat resistant fixing tape 70 placed between the plastic film substrate 20 and the subsidiary substrate 60 along the circumferences thereof. The subsidiary substrate 60 is further fixed onto a processing table 10 by vacuum pressure. An alignment layer 40 for controlling the initial alignment of liquid crystals is then formed on top of the plastic film substrate 20 by first coating an alignment material using an off-set printing method, and rubbing the alignment material with a rubbing rag 50 as shown in FIG. 1b, resulting in a lower plastic substrate 100 as shown in FIG. 1c. A corresponding upper plastic substrate 200 is formed using the processes described above.

A liquid crystal cell is formed between the lower and upper plastic substrates 100 and 200 by facing the lower and upper substrates 100 and 200 at a distance, i.e., cell gap, and partially joining them together with a sealant 30. Subsequently, the fixing tapes 70 on the lower and upper plastic substrates 100 and 200 are removed therefrom and then divided to form liquid crystal cells. These cells are filled up with appropriate liquid crystals to form liquid crystal displays.

In the above-mentioned prior art method for fabricating a LCD with a plastic film substrate, there exist a number of shortcomings. For example, since only circumference of plastic film substrate is glued onto the subsidiary substrate using the heat resistant fixing tape, the plastic film substrate may become unintentionally detached during the manufacturing process and may get damaged by the fixing tape during the detaching process. Further, as shown in FIG. 1c, in order for the processes described above to work, steps must be created on the plastic film substrate along the edge thereof, and this, considering the thickness of the plastic substrate, is extremely difficult and hence costly. In addition, air bubbles may form between the plastic film substrate and the subsidiary substrate, detrimentally affecting the yield and the cost. Finally, the divided subsidiary substrates are not allowed to be reused, increasing the overall manufacturing cost.

SUMMARY OF THE INVENTION

It is, therefore, a primary object of the present invention to provide a method for fabricating a LCD based on a plastic film substrate capable of preventing the plastic film substrate from being unintentionally detached, being damaged during the manufacturing thereof, and lowering the manufacturing cost thereof.

In accordance with one aspect of the present invention, there is provided a method for fabricating a plastic film LCD, the method comprising the steps of: attaching a double-sided adhesive tape to a supporting plate using one side thereof; fixing a plastic film substrate onto the supporting plate using an unused side of the double-sided adhesive tape after putting the plastic film substrate and the supporting plate with the double-sided adhesive tape attached thereto through a predetermined thermal treatment to thereby form a lower substrate including the supporting plate, plastic film substrate and the double-sided adhesive tape therebetween; preparing an upper substrate using the steps described above; conducting a substrate forming process on each of the lower and the upper substrates; depositing an orientation film on both the lower substrate and the upper substrate, and rubbing the orientation film; detaching the plastic film substrate from the supporting plate of the lower and the upper substrates to form a plastic front substrate and a plastic rear substrate; spraying spacer particles on one of the plastic front substrate and the plastic rear substrate, and dispensing a sealant on the other substrate; and joining the plastic front substrate and the plastic rear substrate at a distance, injecting a liquid crystal material through an injection opening, and closing the injection opening to thereby form a plastic film liquid crystal display.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects and features of the present invention will become apparent from the following description of preferred embodiments given in conjunction with the companying drawings, in which.

DETAILED DESCRIPTION OF THE PREFERRED EMBODIMENT

Herein, a preferred embodiment of the present invention will be described in detail with reference to accompanying drawings.

Figure 1A:
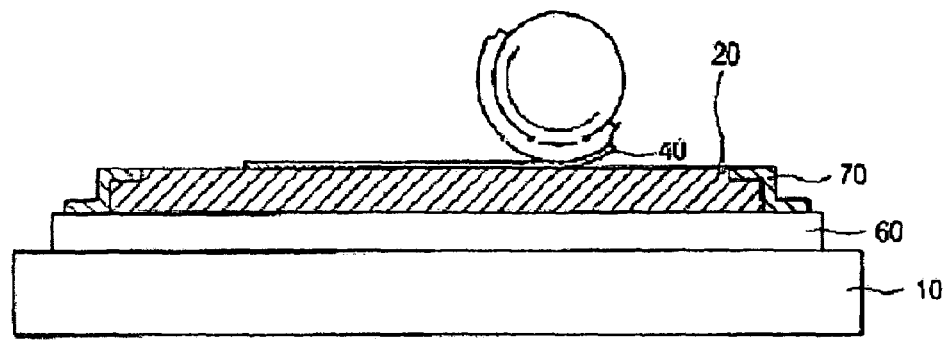
FIGS. 1a through 1c are cross-sectional views illustrating a prior art method for manufacturing a liquid crystal display device using a plastic film substrate.
Figure 1B:
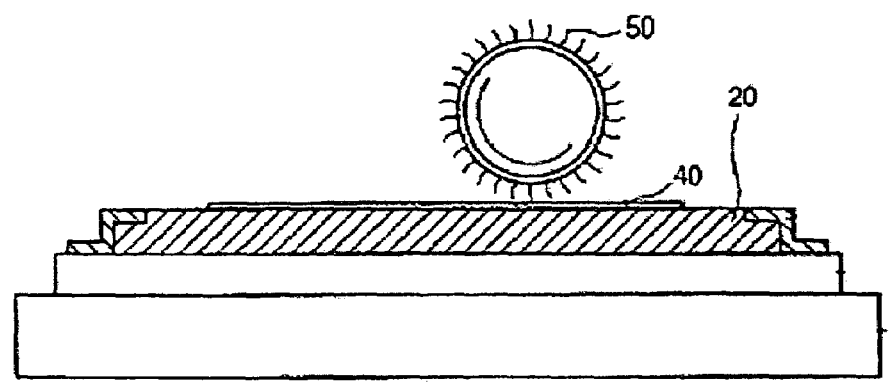
Figure 1C:
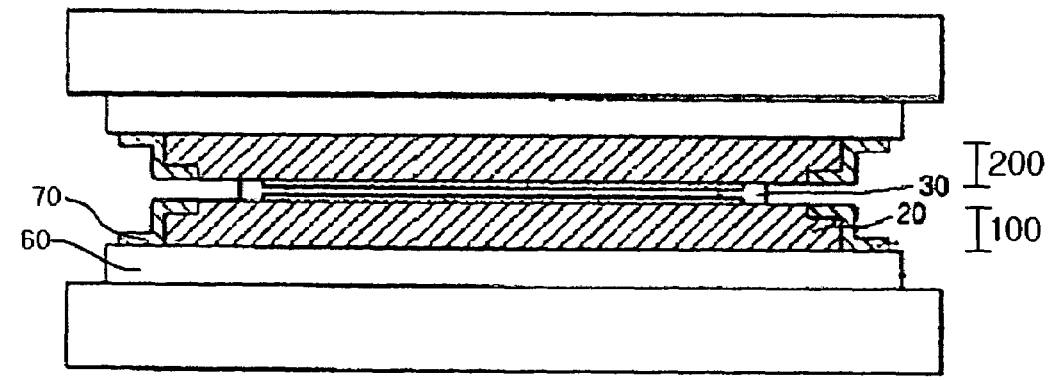
Figure 2A:
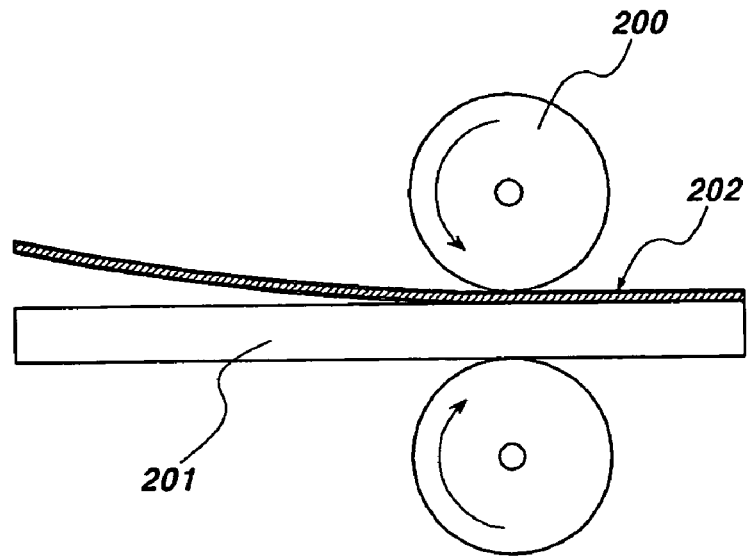
FIGS. 2a through 2g depict cross-sectional views illustrating processes for fabricating LCDs with a plastic film substrate in accordance with a preferred embodiment.
Figure 2B:
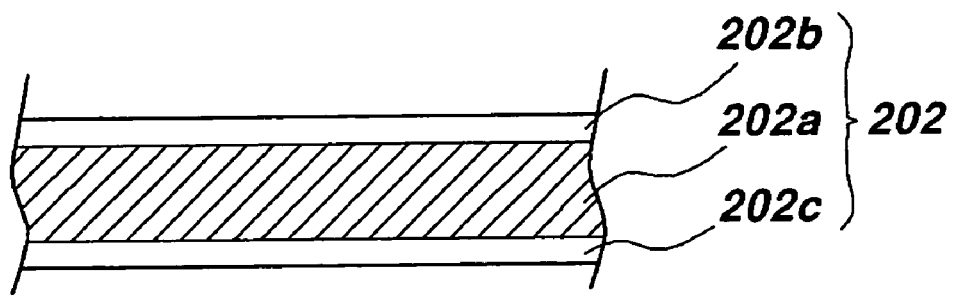

Referring to FIG. 2a, a double-sided adhesive tape 202 for attaching a plastic film substrate 205 to a supporting plate 201 is first attached to the supporting plate 201 using two rotating press rollers 200 (S301). The plastic film substrate 205 used herein comprises a polymer material selected from the group including, for example, polyestersulfone, polyethylene, polycarbonate, polystyrene, polyethylene terephthalate, polyethylene naphthalate, polybutylene terephthalate, polyphenylene sulfide, polypropylene, aramid, polyamide-imide, polyimide, aromatic polyimide, polyetherimide, acrylonitrile butadiene styrene, and polyvinyl chlorides. The Tg (glass transition temperature) of the plastic film substrate 205 determines the maximum processing temperature allowed in the manufacturing of the plastic film LCDs. The plastic film substrate 205, as shown in FIG. 2d, has a thickness ranging between 50 μm and 500 μm, and an ITO (indium-tin oxide layer) on one of its surfaces. Here, the supporting plate 201 may comprise a rigid material selected from the group including acrylics, metals, and glasses. If the supporting plate 201 is made of a glass, apparatuses for manufacturing AM and PM LCDs based on glass panels may be used to manufacture plastic film AM and plastic film PM LCDs. The supporting plate 201 has a thickness ranging between 0.4 mm and 1.1 mm. The double-sided adhesive tape 202 includes a backing 202a and two different adhesive compositions 202b and 202c as shown in FIG. 2b. The backing 202a is made of a heat-resisting film such as polyimide (hereinafter referred to as "PI") or polyethylene (hereinafter referred to as "PET"). The adhesive compositions 202b and 202c, coated on the either-side of the backing 202a respectively, have different adhesive strength. In addition, the double-sided adhesive tape 202 has a dimension equal to or larger than that of the plastic film substrate 205. The adhesive composition 202c coming in contact with the supporting plate 201 has a larger adhesive strength (i.e., ranging between 300 gf/in and 400 gf/in) than that coming in contact with the plastic film substrate 205, allowing the double-sided adhesive tape 202 to be firmly attached to the supporting plate 201. In contrast, the adhesive composition 202b coming in contact with the plastic film substrate (not shown) has a relatively weak adhesive strength (i.e., ranging between 5 gf/in and 100 gf/in), just enough to hold the plastic film substrate in its place, which, in turn, will prevent the plastic film substrate from being damaged by allowing the plastic film substrate to be easily detached from the supporting plate 201 during a detaching process to be performed later.

Figure 2C:
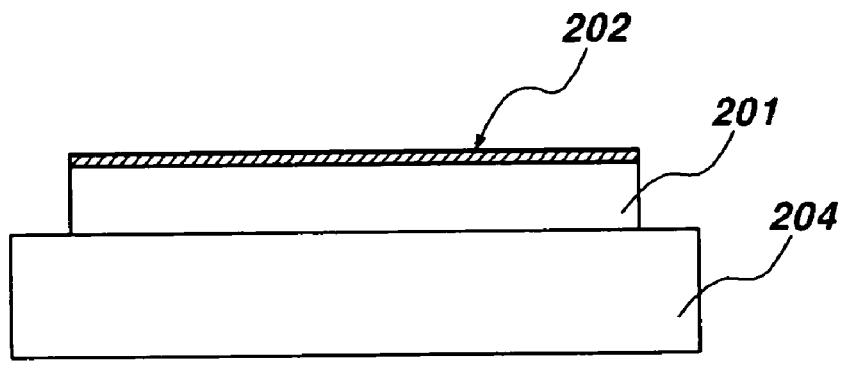
Figure 2D:
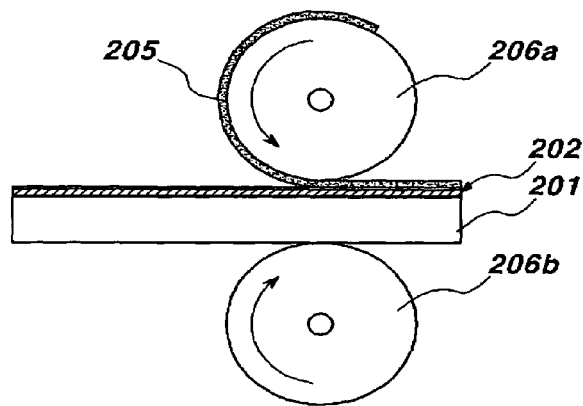

Referring to FIG. 2c, the supporting plate 201 with the double-sided adhesive tape 202 is placed on a hot plate 204 or a hot oven (not shown) and is kept at a predetermined temperature and for a predetermined time, the temperature ranging between 50° C. and 150° C., and the time ranging between 3 minutes and 20 minutes (S302).

Referring to FIG. 2d, the plastic film substrate 205 is adhered to the supporting plate 201, for example, using press rollers 206a and 206b (S303). Before the plastic film substrate 205 is attached to the supporting plate 201, a thermal treatment is performed for the plastic film substrate 205 at a predetermined temperature and for a predetermined time, the temperature ranging between 50° C. and 150° C., and the time ranging between 3 minutes and 20 minutes. The thermal treatment may be conducted by using a separated hot plate (not shown), a hot oven (not shown), or the press roller 206a. If the press roller 206a is adopted for the thermal treatment, the press roller 206a with the plastic film substrate 205 curled therearound is heated to and held at the predetermined temperature and time. The heated plastic film substrate 205 is then rolled out and pressed to be adhered to the supporting plate 201 to thereby form a lower substrate, including the plastic film substrate 205, the supporting plate 201 and the double sided adhesive tape 202 therebetween. The plastic film substrate 205 is fixed onto the supporting plate 201, in such a way that air-bubbles therebetween are minimized. Here, the size of the plastic film substrate 205 may be equal to or smaller than that of the supporting plate 201. An upper substrate 220 is prepared using the processes described hereinabove.

Figure 2E:
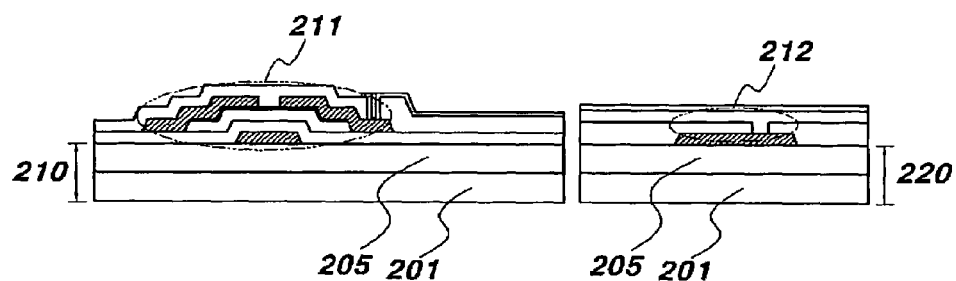
Figure 2F:
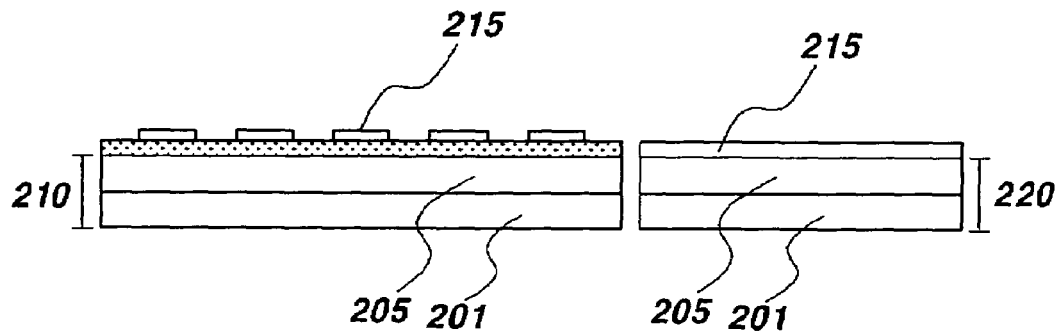

Subsequently, if an AM LCD is fabricated as shown in FIG. 2e, a substrate forming process is performed on the plastic film substrate 205 of the lower substrate 210 to make an AM LCD device such as a passivation layer and pixel electrode. In addition, color filter 212 and transparent electrode 211 are formed on the plastic film substrate 205 of the upper substrate 220. Alternatively, if a PM LCD is fabricated as shown in FIG. 2f, predetermined transparent electrodes 215 are formed on the plastic film substrate 205 of both the lower substrate 210 and the upper substrate 220 (S304).

Subsequently, an orientation film is placed on both the lower and upper substrates 210 and 220 (S305). Here, the orientation film comprises a polymer film such as polyimide. Next, the orientation film is rubbed to align the liquid crystals.

Figure 2G:
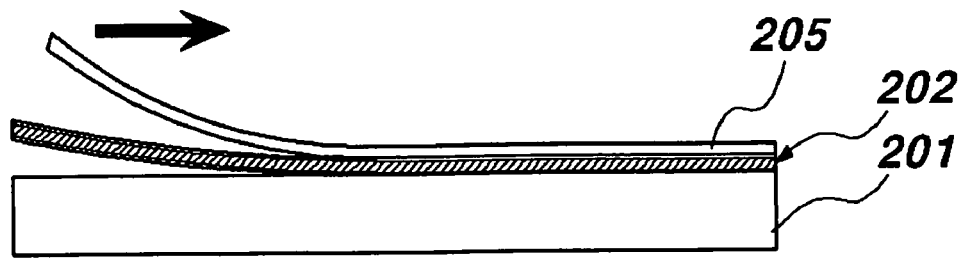

Referring to FIG. 2g, the plastic film substrate 205 is detached from the supporting plate 201 of the lower substrate 210 to make a plastic front substrate (S306). In addition, a plastic rear substrate is formed by detaching the plastic film substrate 205 from the supporting plate 201 of the upper substrate 220. Here, because the detachment process is performed before a cutting process, the supporting plate 201 may be continuously reused. Subsequently, depending on the size of LCDs to be manufactured, a punching process is conducted. For example, in order to make small size LCDs, the punching process is performed to expose gate electrode pads on one of the plastic front and rear substrates in a later process by removing a predetermined part of one of the substrates.

A sealant is then deposited on the orientation film of one of the plastic front and rear substrates. A screen printing method is used for mass production to achieve a high throughput and high performance. A sealant dispensing method is performed for a smaller production volume and higher design flexibility. The sealant has to be pre-cured in a hot oven before the substrate on which the sealant is deposited is forwarded to the assembly machine. In order to create a uniform distance between the substrates, spacer particles, which are either spheres or rod of glasses or of a plastic, are sprayed on the orientation film of the other substrate. These spacers have precise dimensions and are used to maintain a uniform cell gap. Here, several methods such as dry spray, semi-dry spacer spray, and wet spacer spray may be used (S307).

Subsequently, the plastic front substrate and the plastic rear substrate are made to face each other and joined together (S308) at a predetermined distance. Therefore, the orientation films of both the plastic front substrate and the rear substrate face with each other and the orientation film deposited on one plastic substrate contacts the spacers formed on the other plastic substrate.

The sealant is then cured to make the plastic front and rear substrates adhere to each other, thereby forming a semi-completed panel (S309).

Next, the semi-completed panel is cut and divided into panel units (S310). A liquid crystal material is then injected through an injection opening of the semi-completed panel (S311). After filling the liquid crystal into the semi-completed panel, the injection opening is closed (S312).

Polarizer films are then attached in parallel to the rubbing direction of the orientation films to the front side and the back side of the semi-completed panel (S313) to thereby form a LCD.

Figure 2H:
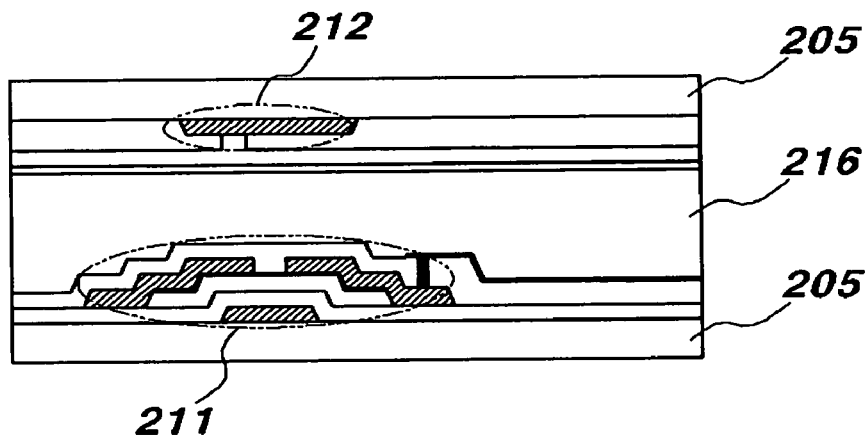
FIG. 2h illustrates a cross-sectional view of an AM LCD constructed pursuant to the processes illustrated in FIGS. 2a through 2g.

FIG. 2h is a cross-sectional view of an example AM LCD constructed pursuant to the processes illustrated in FIGS. 2a through 2g. Referring to FIG. 2h, the AM LCD comprises the plastic film substrates 205, a TFT 211, a color filter 212, and the liquid crystal 216.

Figure 2I:
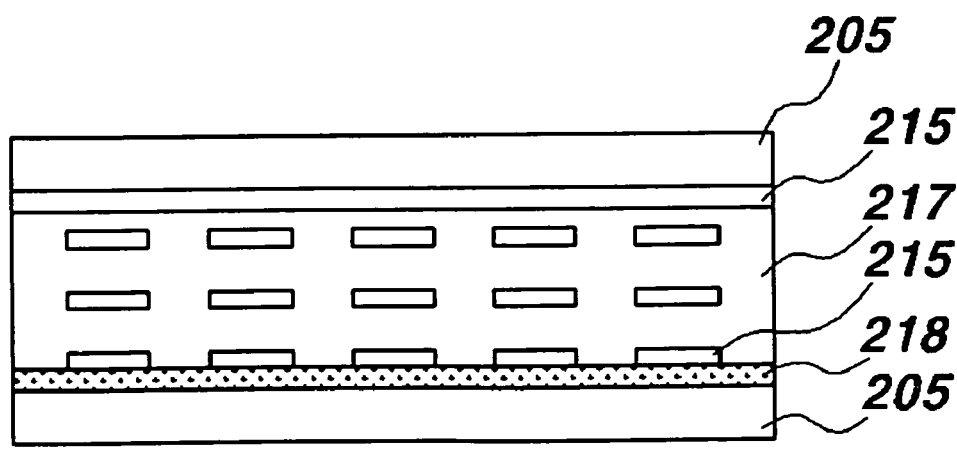
FIG. 2i represents a cross-sectional view of a PM LCD constructed pursuant to the processes illustrated in FIGS. 2a through 2g.
Figure 3:
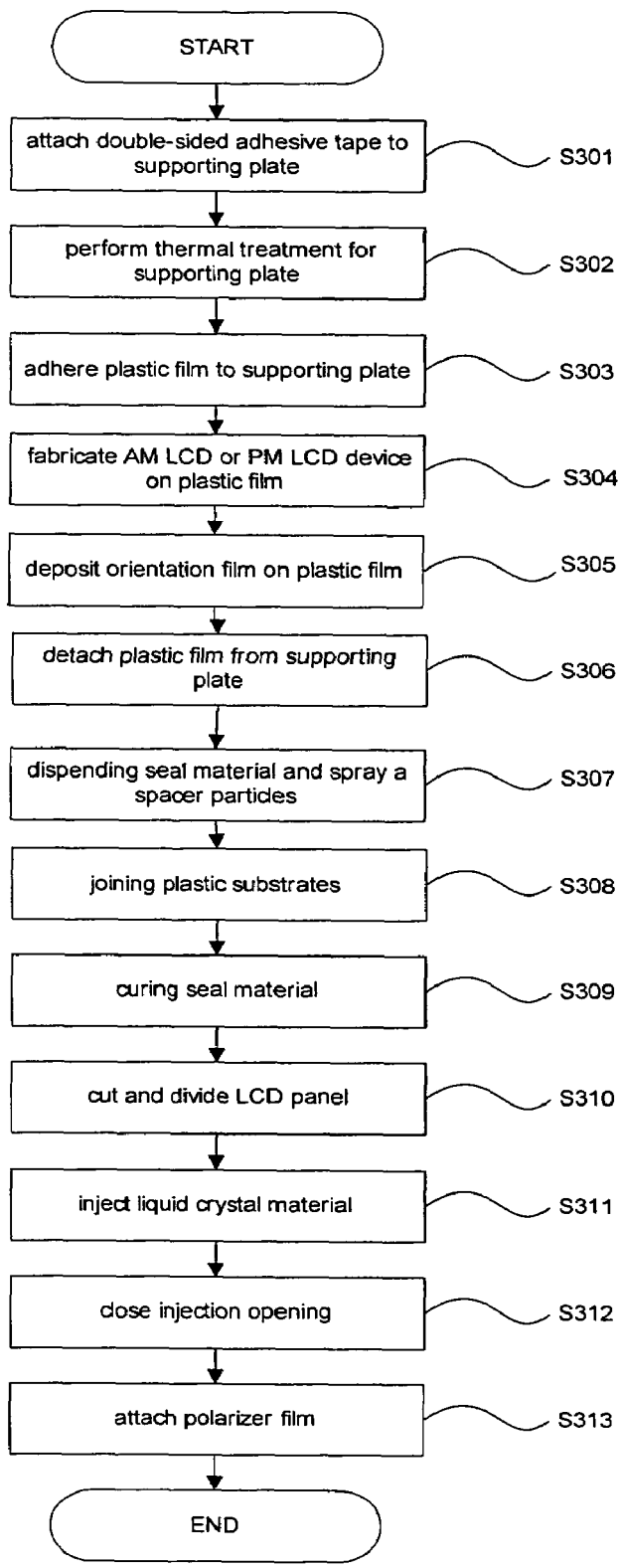
FIG. 3 shows, in a flowchart, the method for fabricating LCDs with a plastic film substrate of the present invention according to another preferred embodiment of the present invention.

FIG. 2i is a cross-sectional view of an example PM LCD constructed pursuant to the process illustrated in FIGS. 2a through 2g. Referring to FIG. 2i, the PM LCD comprises the plastic film substrates 205, a reflective layer 218, transparent electrodes 215, and the liquid crystal 217.

The present invention allows mass production of LCDs based on the plastic film substrate with low cost by using existing LCD manufacturing apparatuses and reusing the supporting plates. By using the double-sided adhesive tape having different adhesive strength, the present invention, as well as minimizing damages to the plastic film substrate as a consequence of the side with a weak adhesive strength coming in contact with the plastic film substrate, prevents unintentional detachment of the plastic film substrate by providing an adhesion between the plastic film and supporting plate throughout entire surfaces. Moreover, by minimizing the presence of the air bubbles between the plastic film substrate and the supporting plate by applying the double-sided adhesive tape to the entire surface of the plastic film substrate and the supporting plate, the present invention, can also improve the overall yield.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a liquid crystal display based on a plastic film substrate comprising the steps of:
   attaching a double-sided adhesive tape to a supporting plate using one side thereof;
   fixing a plastic film substrate onto the supporting plate using an unused side of the double-sided adhesive tape after putting the plastic film substrate and the supporting plate with the double-sided adhesive tape attached thereto through a predetermined thermal treatment to thereby form a lower substrate including the supporting plate, plastic film substrate and the double-sided adhesive tape therebetween;
   preparing an upper substrate using the steps described above;
   conducting a substrate forming process on each of the lower and the upper substrates;
   depositing an orientation film on both the lower substrate and the upper substrate, and rubbing the orientation film;
   detaching the plastic film substrate from the supporting plate of the lower and the upper substrates to form a plastic front substrate and a plastic rear substrate;
   spraying spacer particles on one of the plastic front substrate and the plastic rear substrate, and dispensing a sealant on the other substrate; and
   joining the plastic front substrate and the plastic rear substrate at a distance, injecting a liquid crystal material through an injection opening, and closing the injection opening to thereby form a plastic film liquid crystal display.

2. The method as defined by claim 1, further comprising performing a punching process on one of the plastic front and rear substrates to expose gate electrode pads after the detaching process.

3. The method as defined by claim 1, wherein the supporting plate comprises a rigid material selected from the group of acrylics, glasses, and metals.

4. The method as defined by claim 1, wherein the supporting plate has a thickness ranging between 0.4 mm and 1.1 mm.

5. The method as defined by claim 1, wherein the double-sided adhesive tape comprises a backing and adhesive compositions coated on the both sides of the backing.

6. The method as defined by claim 5, wherein the backing comprises a heat-resisting film such as PI or PET.

7. The method as defined by claim 5, wherein the adhesive composition coming in contact with the supporting plate has an adhesive strength ranging between 300 gf/in and 400 gf/in.

8. The method as defined by claim 5, wherein the adhesive composition coming in contact with the plastic film substrate has an adhesive strength ranging between 5 gf/in and 100 gf/in.

9. The method as defined by claim 1, wherein the plastic film substrate has the thickness ranging between 50 μm and 500 μm.

10. The method as defined by claim 1, wherein the substrate forming process comprises forming of an active matrix (AM).

11. The method as defined by claim 1, wherein the substrate forming process comprises forming of a passive matrix (PM).

12. The method as defined by claim 1, wherein the thermal treatment is performed on the supporting plate for a duration ranging between 3 minutes and 20 minutes and at a temperature ranging between 50° C. and 150° C.

13. The method as defined by claim 12, wherein the thermal treatment is performed on the supporting plate by using a hot plate or a hot oven.

14. The method as defined by claim 1, wherein the thermal treatment is performed on the plastic film substrate for a duration ranging between 3 minutes and 20 minutes and at a temperature ranging between 50° C. and 150° C.

15. The method as define by claim 14, wherein the thermal treatment is performed on the plastic film substrate by using a hot plate, a hot oven, or a heated press roller.

16. The method as defined by claim 1, wherein a maximum temperature allowed in manufacturing of the plastic film LCD is determined by Tg (glass transition temperature) of the plastic film substrate used.

17. The method as define by claim 1, wherein the plastic film substrate comprise a polymer material selected from the group including polyestersulfone, polyethylene, polycarbonate, polystyrene, polyethylene terephthalate, polyethylene naphthalate, polybutylene terephthalate, polyphenylene sulfide, polypropylene, aramid, polyamide-imide, polyimide, aromatic polyimide, polyetherimide, acrylonitrile butadiene styrene, and polyvinyl chlorides.

18. The method as defined by claim 1, wherein the size of the double-sided adhesive tape is equal to or larger than that of the plastic film substrate and the size of the plastic film substrate is equal to or smaller than that of the supporting plate.

* * * * *